(12) United States Patent
Kim

(10) Patent No.: US 6,387,789 B1
(45) Date of Patent: May 14, 2002

(54) METHOD FOR FABRICATING SEMICONDUCTOR DEVICE

(75) Inventor: Jong Kwan Kim, Chungcheongbuk-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/455,497

(22) Filed: Dec. 6, 1999

(30) Foreign Application Priority Data

Aug. 9, 1999 (KR) .............................. 99/32642

(51) Int. Cl.[7] ................ H01L 21/3205; H01L 21/4763; H01L 21/44
(52) U.S. Cl. ...................... 438/592; 438/649; 438/655; 438/651
(58) Field of Search .................. 438/592, 595, 438/282, 526, 532, 300, 302, 303, 301, 279, 587, 639, 649, 651, 655, 656, 689, 696

(56) References Cited

U.S. PATENT DOCUMENTS 5,434,093 A * 7/1995 Chau et al. ................. 438/300
5,668,021 A * 9/1997 Subrmanian et al. ....... 438/282

* cited by examiner

Primary Examiner—Charles Bowers
Assistant Examiner—Brook Kebede
(74) Attorney, Agent, or Firm—Morgan, Lewis & Bockius LLP

(57) ABSTRACT

Method for fabricating a semiconductor device, including the steps of (1) forming a gate insulating film, a silicon layer, and an insulating film on a substrate in succession, (2) selectively removing a portion of the insulating film on which a gate electrode is to be formed, (3) forming first sidewalls at sides of the insulating film having the portion removed therefrom, (4) forming silicide on a surface of the exposed silicon, (5) forming a cap insulating film on the silicide and the first sidewalls, (6) removing the insulating film, and (7) using the cap insulating film as a mask in removing the exposed silicon layer, to form the gate electrode.

18 Claims, 9 Drawing Sheets

METHOD FOR FABRICATING SEMICONDUCTOR DEVICE

BACKGROUND OF THE INVENTION

1. Field of the Invention

The present invention relates to a method for fabricating a semiconductor device, and more particularly, to a method for forming a polycide gate.

2. Background of the Related Art

Currently, a gate of a semiconductor device of a size below 0.18 μm class is fabricated by forming a metal gate of tungsten and the like on polysilicon, or by stacking silicide on the polysilicon for forming polycide, particularly, memory cells have gates of metal mostly, logic device uses a dual gate, and a silicide process is generally used. In a case of an embedded memory in which technologies of memory and logic are combined and is a product expected to be paid attention in near future, though a gate structure is newly required, which has interchangeability with both of the two gate structures, employment of the two technologies as they are is difficult. As the salicide technology for a size below 0.18 μm class is mostly the cobalt salicide technology, it is impossible to obtain an embedded memory by an existing technology because etching of the cobalt salicide material is impossible. Therefore, the cobalt salicide is formed only on a region where the gate electrode is to be formed.

A related art method for forming the aforementioned polycide gate will be explained with reference to the attached drawings. FIGS. 1A~1H illustrate sections showing the steps of a related art method for forming a polycide gate electrode.

Referring to FIG. 1A, an active region and a field region are defined on a silicon substrate 1, and a field oxide film 2 is formed in the field region. As shown in FIG. 1B, a gate insulating film 8, a polysilicon 3, and an insulating film 4 are formed in succession on an entire surface of the substrate having the field oxide film formed therein. The insulating film 4 is formed of nitride. As shown in FIG. 1C, a photoresist film 6 is deposited on the insulating film 4, and subjected to exposure and development to define a gate electrode pattern region at first. Then, the insulating film 4 on the gate electrode pattern region is removed, selectively. As shown in FIG. 1D, cobalt is deposited on an entire surface, and reaction between the cobalt and the polysilicon 3 is caused at a surface of the exposed polysilicon 3 in the gate electrode pattern region, to form polycide 10. That is, though the polycide is formed at an interface of the cobalt and the polysilicon 3, no polycide is formed on the insulating film 4. Therefore the cobalt that made no reaction is removed. In this instance, as the polycide 10 is formed along the polysilicon 3, the gate electrode pattern region is defined larger than actually required, to cause a defective pattern when the polysilicon 3 is removed in a following process. As shown in FIG. 1E, a thick cap insulating film is deposited on an entire surface. As shown in FIG. 1F, the cap insulating film 11 is subjected to CMP(Chemical Mechanical Polishing) to remove the cap insulating film 11 until a surface of the first insulating film 4 is exposed. As shown in FIG. 1G, the insulating film 4 is removed such that the cap insulating film 11 is left on the gate electrode pattern region. Phosphoric acid is used in removing the insulating film 4 if the insulating film 4 is formed of a nitride. As shown in FIG. 1H, the left cap insulating film 11 and the polycide 10 are used as masks in removing the polysilicon 3 selectively, to form a gate electrode, finally.

However, the method for forming a polycide gate electrode has the following problems.

The gate electrode is formed by depositing a nitride film on a polysilicon, exposing a region of the polysilicon on which the gate electrode is to be formed, and forming cobalt silicide only on the region. However, because the cobalt silicide is formed larger than a gate electrode area, uniformity of critical dimensions of gate electrode lengths is deteriorated.

SUMMARY OF THE INVENTION

Accordingly, the present invention is directed to a method for fabricating a polycide gate that substantially obviates one or more of the problems due to limitations and disadvantages of the related art.

An object of the present invention is to provide a method for fabricating a polycide gate which can stabilize uniformity of critical dimensions of gate electrode lengths.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating a semiconductor device includes the steps of (1) forming a gate insulating film, a silicon layer, and an insulating film on a substrate in succession, (2) selectively removing a portion of the insulating film on which a gate electrode is to be formed, (3) forming first sidewalls at sides of the insulating film having the portion removed therefrom, (4) forming silicide on a surface of the exposed silicon, (5) forming a cap insulating film on the silicide and the first sidewalls, (6) removing the insulating film, and (7) using the cap insulating film as a mask in removing the exposed silicon layer, to form the gate electrode.

In other aspect of the present invention, there is provided a method for fabricating a semiconductor device, including the steps of (1) forming a gate insulating film, a polysilicon layer, and a first insulating film on a substrate in succession, (2) selectively removing a portion of the first insulating film on which a gate electrode is to be formed, (3) forming second insulating film sidewalls at sides of the first insulating film having the portion removed therefrom, (4) forming silicide on a surface of the exposed polysilicon, (5) forming a cap insulating film on the silicide and the second insulating film sidewalls, (6) removing the first insulating film, and (7) using the cap insulating film as a mask in selectively removing the exposed polysilicon layer, to form the gate electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Reference will now be made in detail to the preferred embodiments of the present invention, examples of which are illustrated in the accompanying drawings. FIGS. 2A~2J illustrate sections showing the steps of a method for fabricating a semiconductor device in accordance with a first preferred embodiment of the present invention, and FIGS. 3A~3J illustrate sections showing the steps of a method for fabricating a semiconductor device in accordance with a second preferred embodiment of the present invention.

The method for fabricating a semiconductor device in accordance with a first preferred embodiment of the present invention will be explained.

Figure 1A:
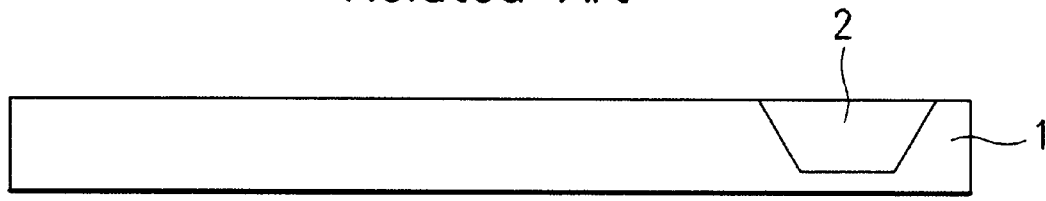
FIGS. 1A~1H illustrate sections showing the steps of a related art method for fabricating a semiconductor device.
Figure 1B:
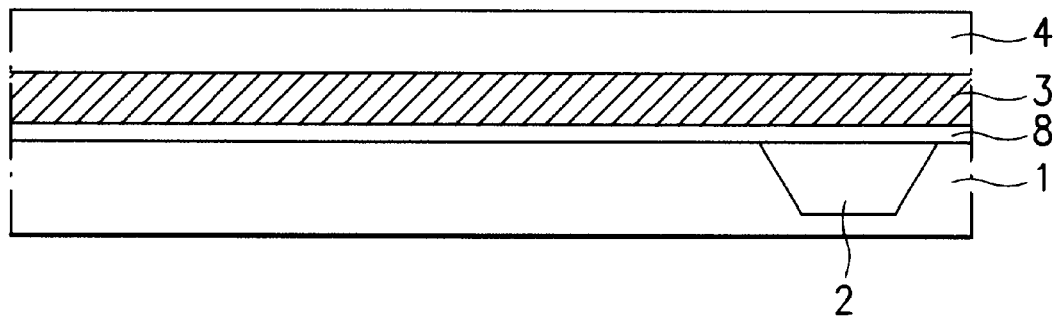
Figure 1C:
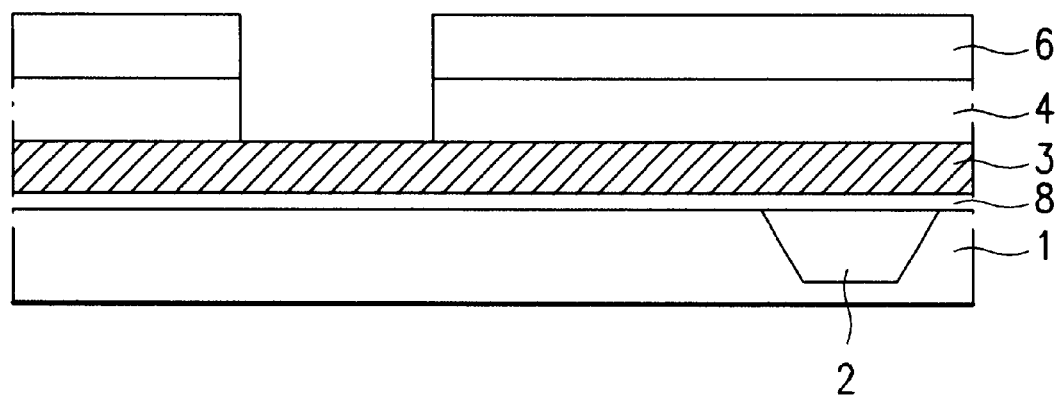
Figure 1D:
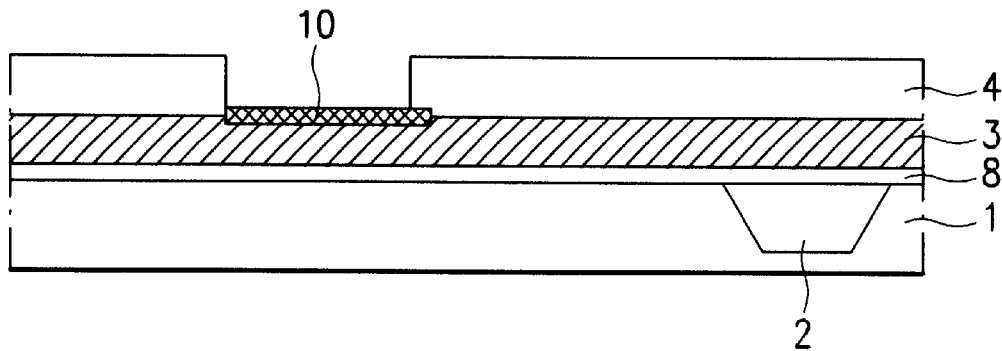
Figure 1E:
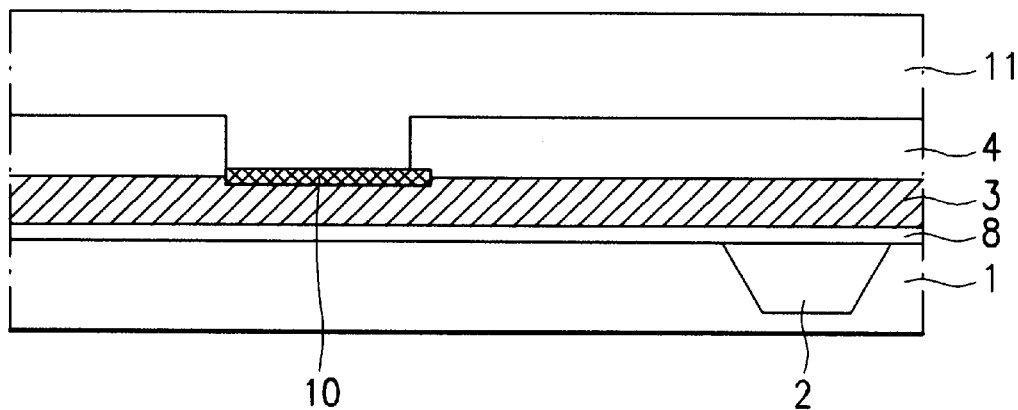
Figure 1F:
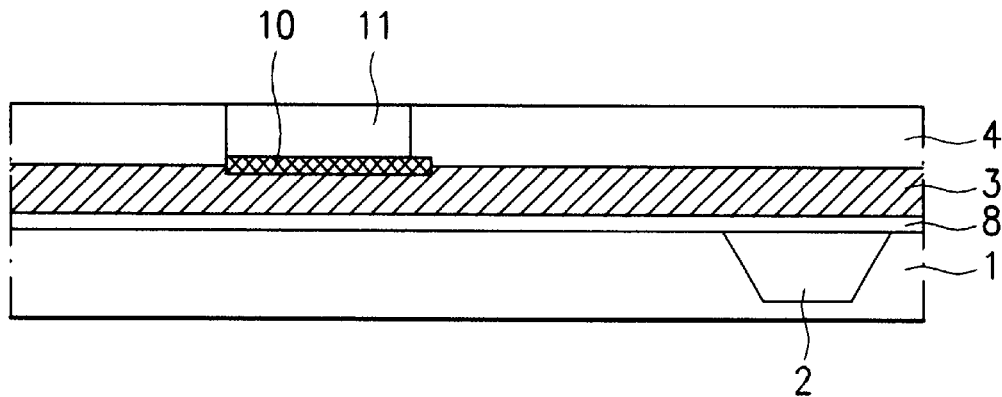
Figure 1G:
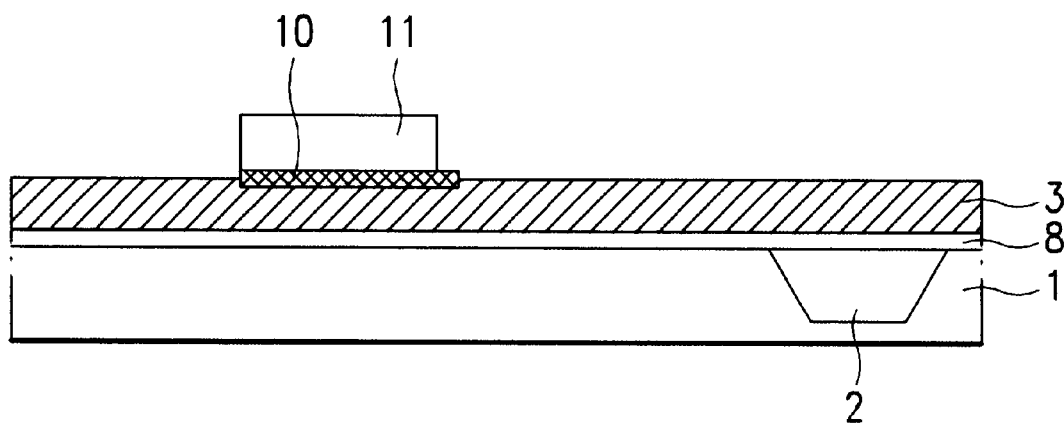
Figure 1H:
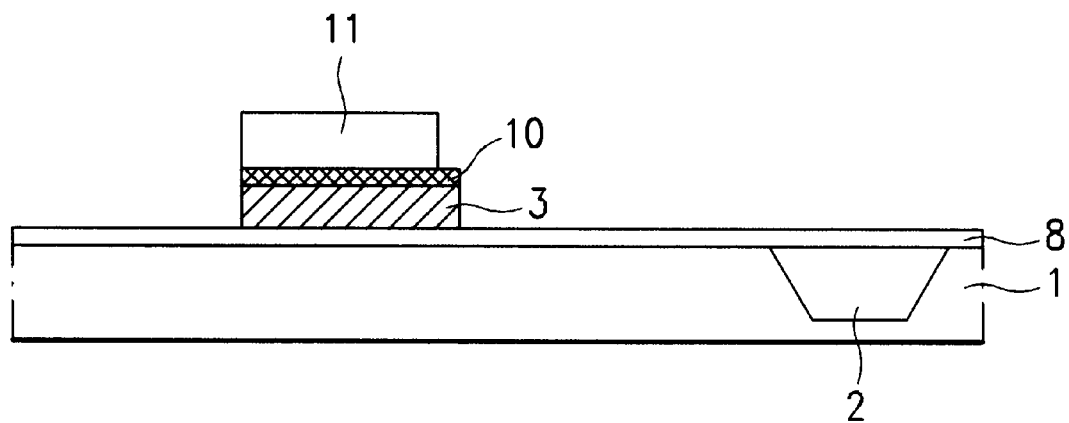
Figure 2A:
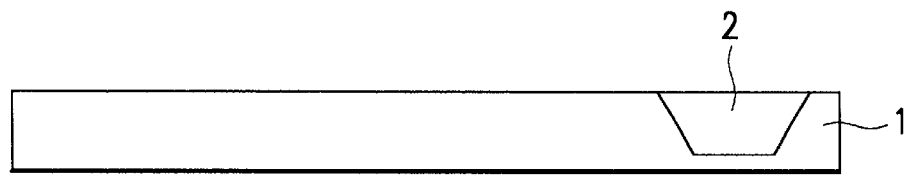
FIGS. 2A~2J illustrate sections showing the steps of a method for fabricating a semiconductor device in accordance with a first preferred embodiment of the present invention; and, FIGS. 3A~3J illustrate sections showing the steps of a method for fabricating a semiconductor device in accordance with a second preferred embodiment of the present invention.
Figure 2B:
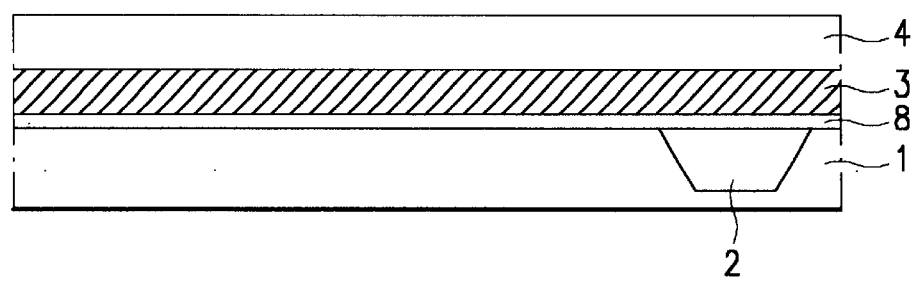
Figure 2C:
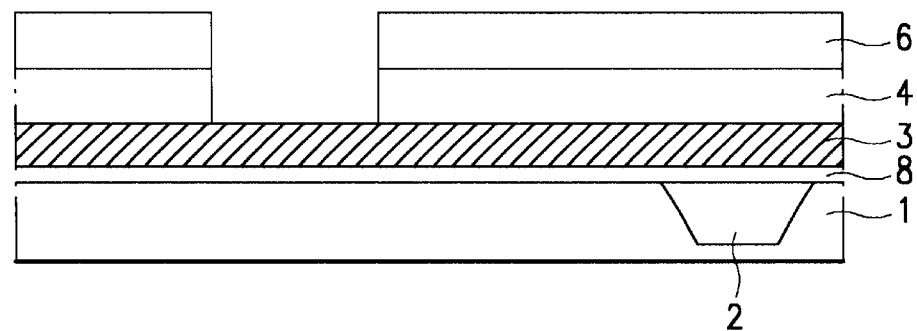
Figure 2D:
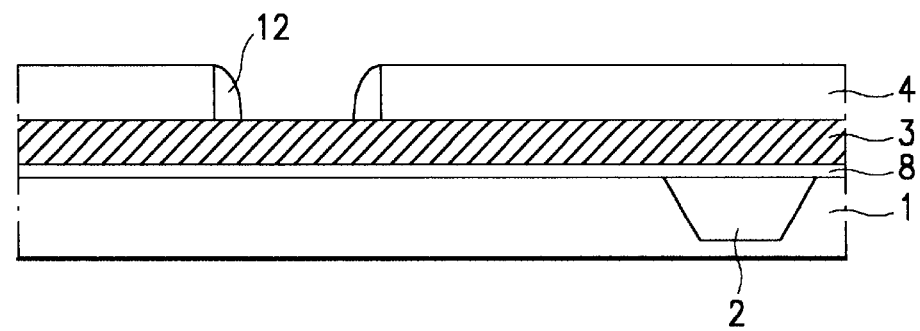
Figure 2E:
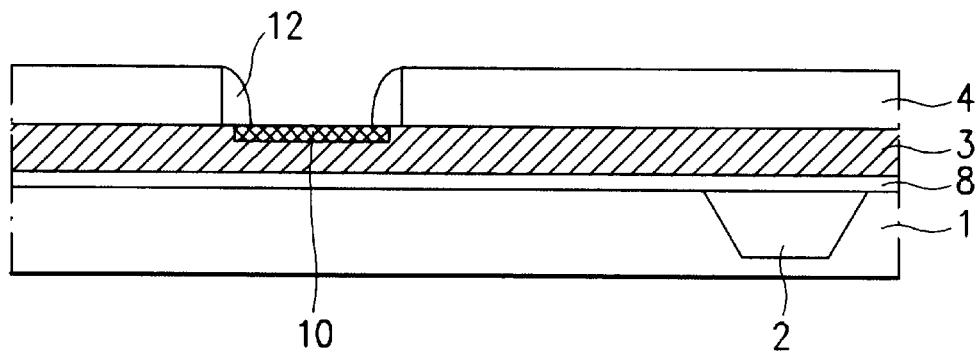
Figure 2F:
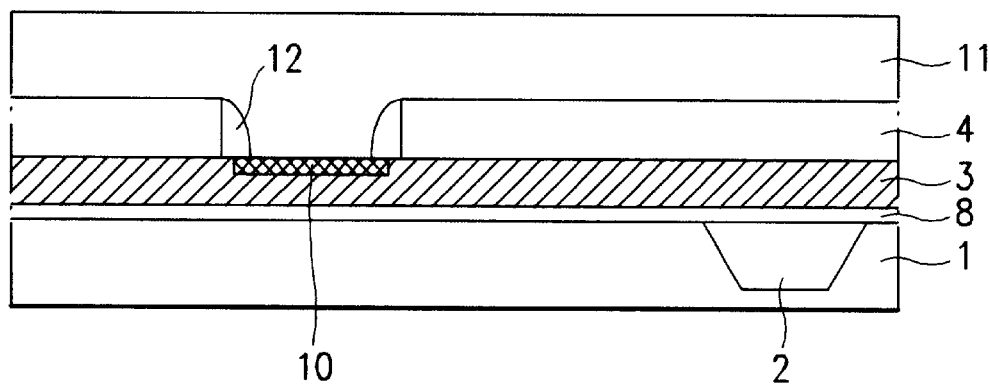
Figure 2G:
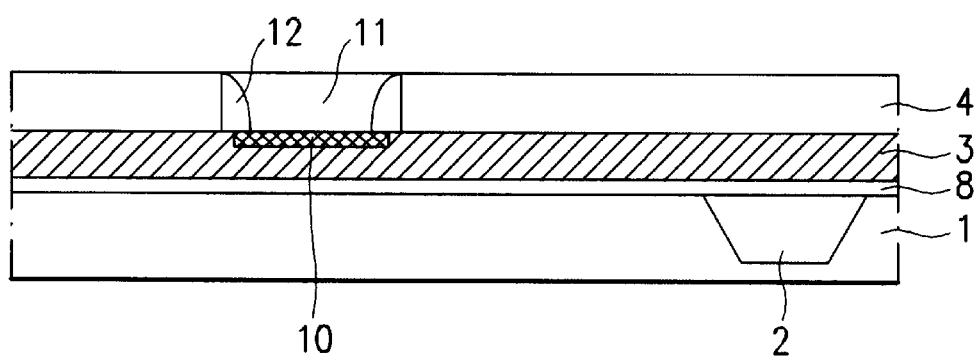
Figure 2H:
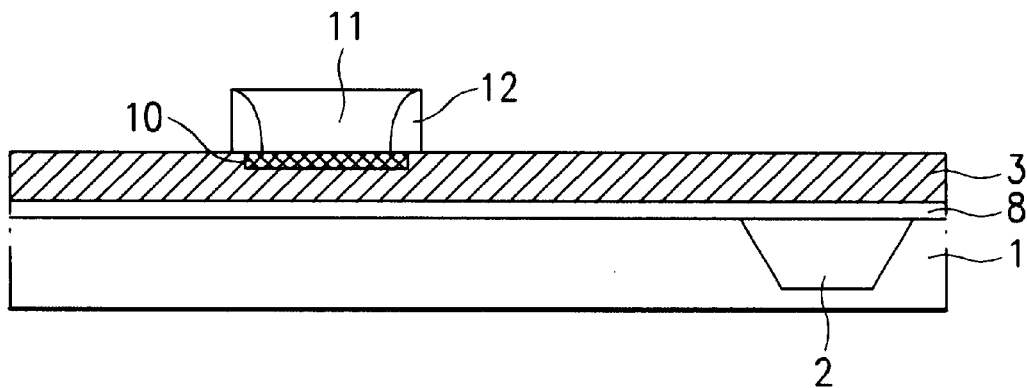
Figure 2I:
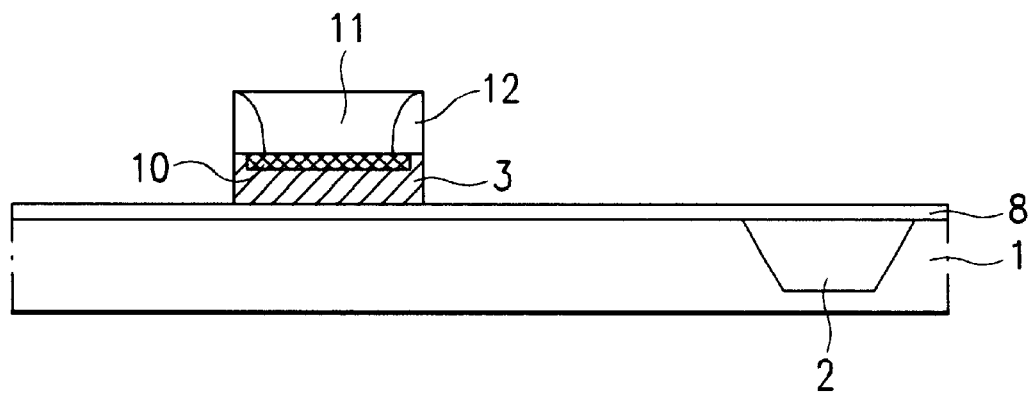
Figure 2J:
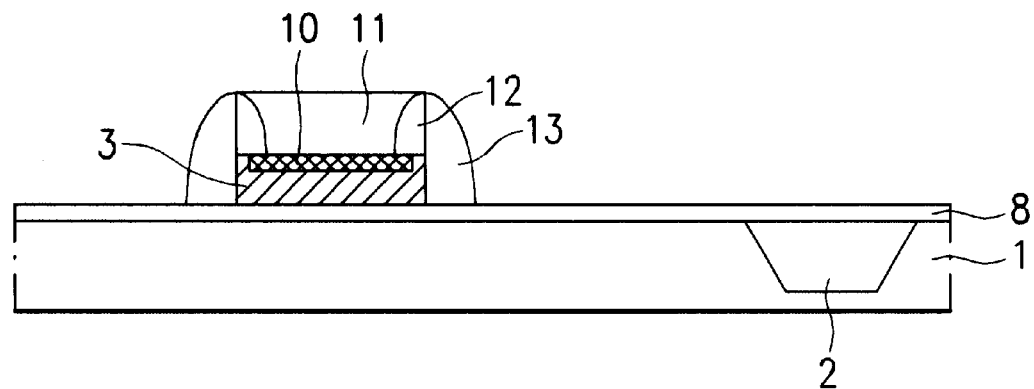

Referring to FIG. 2A, an active region and a field region are defined on a silicon substrate 1, and a field oxide film 2 is formed in the field region. As shown in FIG. 2B, a gate insulating film 8, a polysilicon 3, and an insulating film 4 are formed in succession on an entire surface of the substrate having the field oxide film 2 formed therein. The insulating film 4 is formed of nitride. As shown in FIG. 2C, a photoresist film 6 is deposited on the insulating film 4 and subjected to exposure and development to define a gate electrode pattern region at first. Then, the insulating film 4 in the gate electrode pattern region is removed, selectively. As shown in FIG. 2D, insulating film sidewalls 12 are formed at sides of the insulating film 4 having the gate electrode pattern region removed therefrom. The insulating film sidewalls 12 are formed of an oxide. As shown in FIG. 2E, cobalt is deposited on an entire surface, and the cobalt and the silicon of the exposed polysilicon 3 on the gate electrode pattern region are caused to make a reaction at a surface of the exposed polysilicon 3, to form polycide 10. That is, though the polycide is formed at an interface of the cobalt and polysilicon 3, no polycide is formed on the insulating film 4 and the insulating film sidewalls 12. Then, the cobalt that made no reaction is removed. As shown in FIG. 2F, a thick cap insulating film 11 is formed on an entire surface. As shown in FIG. 2G, the cap insulating film 11 is subjected to CMP until a surface of the insulating film 4 is exposed. As shown in FIG. 2H, the insulating film 4 is removed such that the cap insulating film 11 and the insulating film sidewalls 12 are left on the gate electrode pattern region. Phosphoric acid is used in the removal if the insulating film 4 is formed of a nitride. As shown in FIG. 2I, the remained cap insulating film 11, the insulating film sidewalls 12, and the polycide 10 are used as masks in selectively removing the polysilicon 3, to form a gate electrode. As shown in FIG. 2J, second insulating sidewalls 13 are formed at sides of the gate electrode.

The method for fabricating a semiconductor device in accordance with a second preferred embodiment of the present invention will be explained.

Figure 3A:
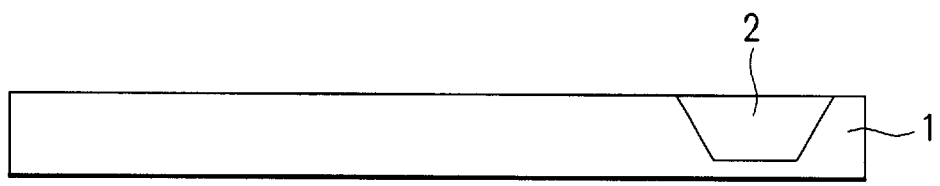
Figure 3B:
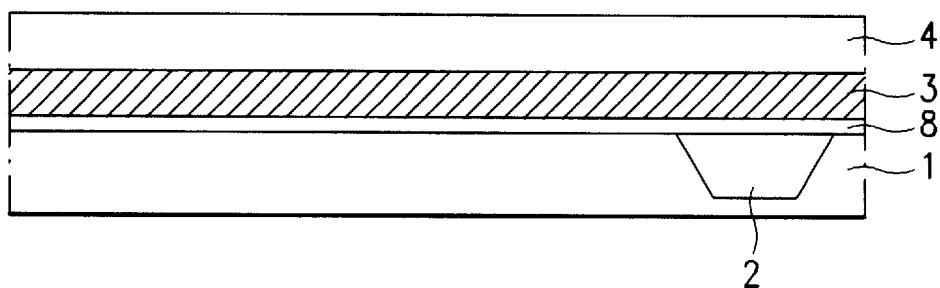
Figure 3C:
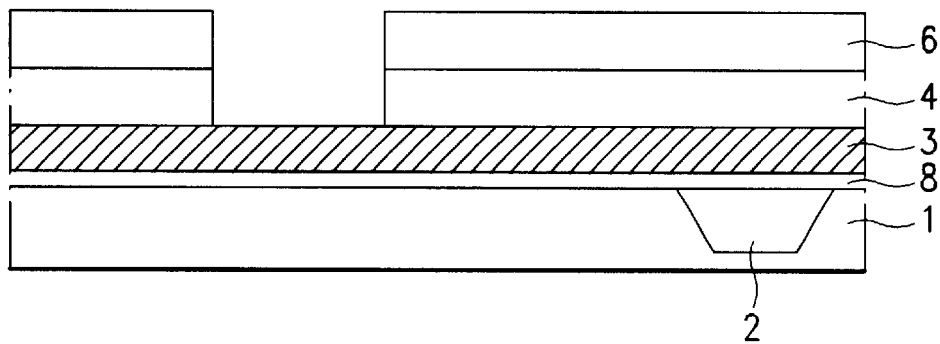
Figure 3D:
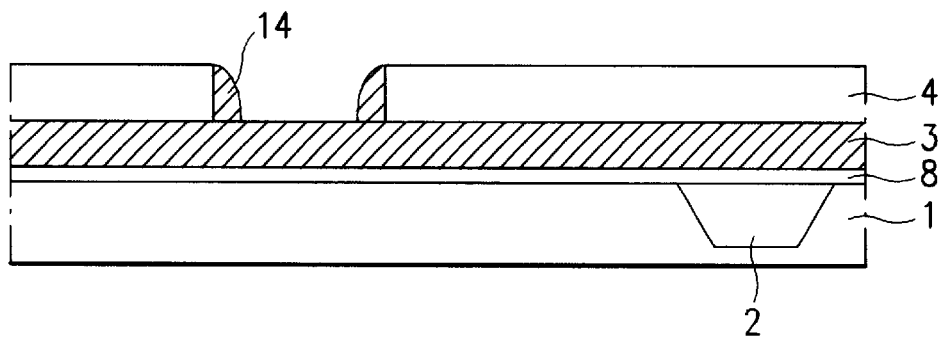
Figure 3E:
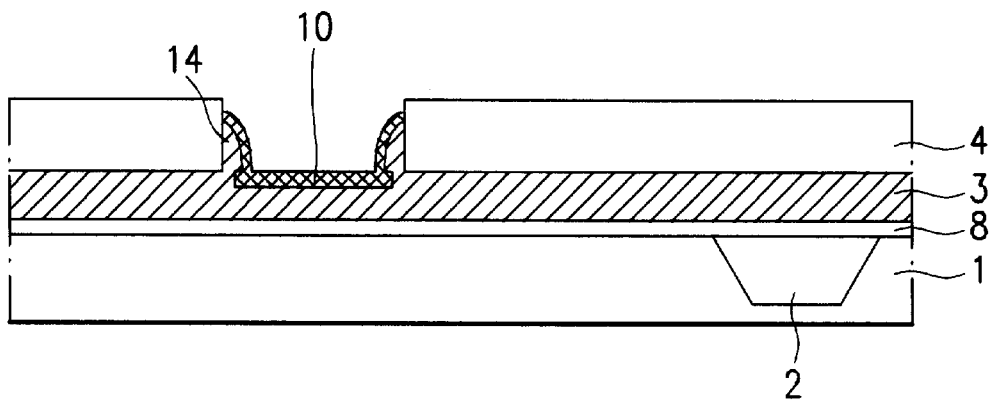
Figure 3F:
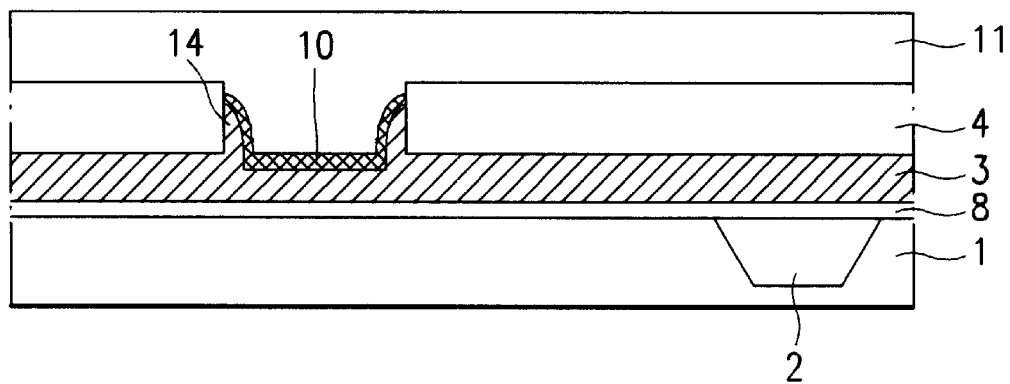
Figure 3G:
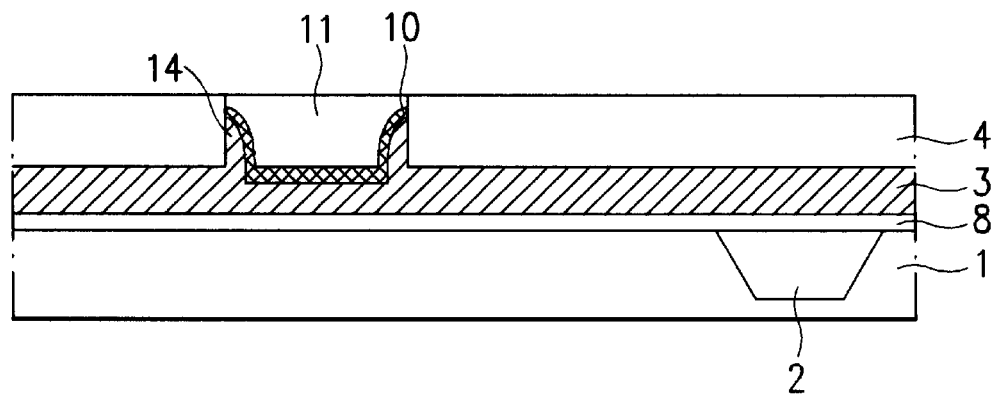
Figure 3H:
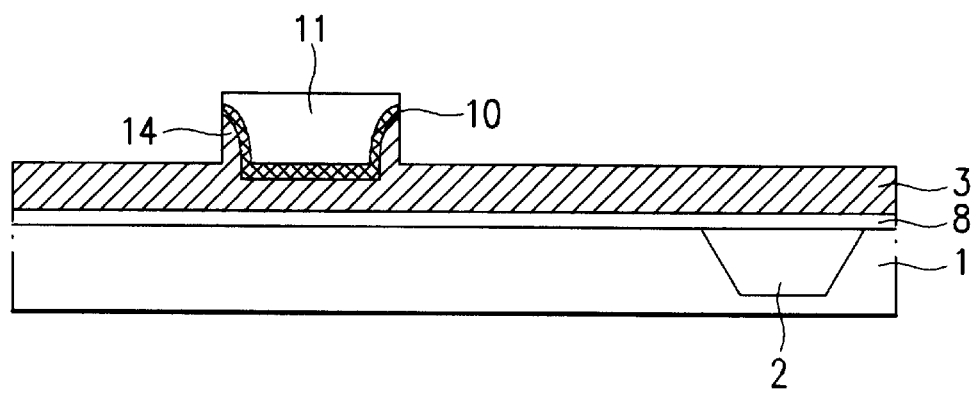
Figure 3I:
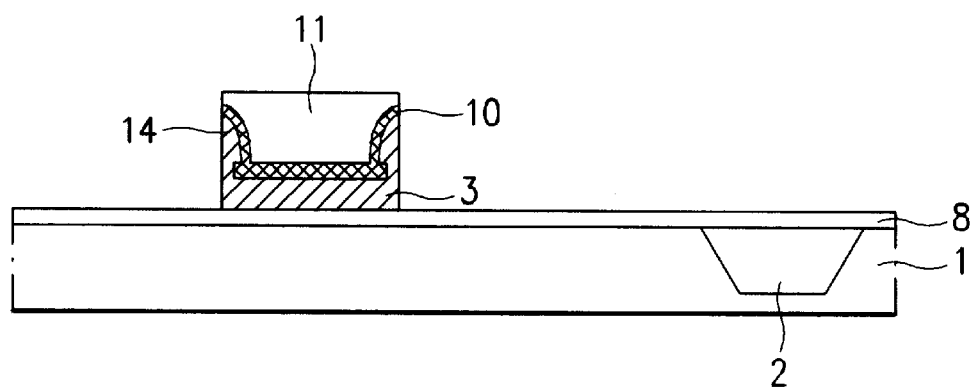
Figure 3J:
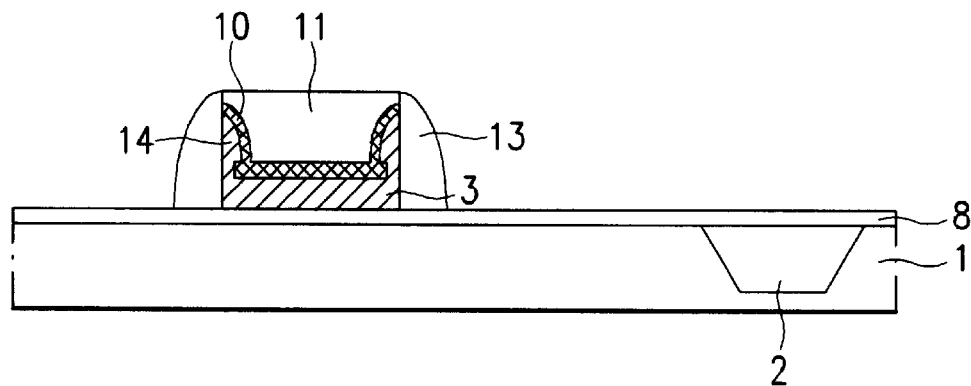

Referring to FIG. 3A, an active region and a field region is defined on the silicon substrate 1, and a field oxide film 2 is formed on the field region. As shown in FIG. 3B, a gate insulating film 8, a polysilicon 3, and an insulating film 4 are formed in succession on an entire surface of the substrate having the field oxide film 2 formed therein. The insulating film 4 is formed of nitride. As shown in FIG. 3C, a photoresist film 6 is deposited on the insulating film 4 and subjected to exposure and development to define a gate electrode pattern region at first. Then, the insulating film 4 in the gate electrode pattern region is removed, selectively. As shown in FIG. 3D, polysilicon sidewalls 14 are formed at sides of the insulating film 4 having the gate electrode pattern region removed therefrom. As shown in FIG. 3E, cobalt is deposited on an entire surface, and the cobalt and the silicon both of the exposed polysilicon 3 and the polysilicon sidewalls 14 on the gate electrode pattern region are caused to make a reaction at surfaces of the exposed polysilicon 3 and the polysilicon sidewalls 14, to form polycide 10. That is, though the polycide is formed at an interface of the cobalt and polysilicon 3 and the polysilicon sidewalls 14, no polycide is formed on the insulating film 4. Then, the cobalt that made no reaction is removed. As shown in FIG. 3F, a thick cap insulating film 11 is deposited on an entire surface. As shown in FIG. 3G, the cap insulating film 11 is subjected to CMP until a surface of the insulating film 4 is exposed. As shown in FIG. 3H, the insulating film 4 is removed such that the cap insulating film 11 and the polysilicon sidewalls 14 are left on the gate electrode pattern region. Phosphoric acid is used in the removal if the insulating film 4 is formed of a nitride. As shown in FIG. 3I, the remained cap insulating film 11, the polysilcon sidewalls 14, and the polycide 10 are used as masks in selectively removing the polysilicon 3, to form a gate electrode. As shown in FIG. 3J, second insulating sidewalls 13 are formed at sides of the gate electrode.

As has been explained, the method for fabricating a semiconductor device has the following advantages.

First, an insulating film is deposited on a polysilicon, the insulating film is removed to expose a region on which a gate electrode is to be formed only, sidewalls of an insulating film or polysilicon are formed at sides of the insulating film, and the cobalt silicide is formed on surfaces of the exposed polysilicon, or exposed polysilicon and polysilicon sidewalls. Accordingly, formation of the cobalt silicide larger than a gate electrode area in formation of the cobalt silicide is prevented, to improve uniformity of critical dimensions of electrode lengths.

Second, because the polysilicon sidewalls are formed at sides of the insulating film sides and the cobalt silicide is formed on surfaces of the exposed polysilicon and polysilicon sidewalls, a sheet resistivity of the gate electrode can be reduced.

It will be apparent to those skilled in the art that various modifications and variations can be made in the method for fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device, comprising the steps of:

(1) forming a gate insulating film, a silicon layer, and an insulating film on a substrate in succession;

(2) selectively removing a portion of the insulating film on which a gate electrode is to be formed;

(3) forming first sidewalls at sides of the insulating film having the portion removed therefrom;

(4) forming silicide on a surface of a first exposed portion of the silicon layer;

(5) forming a cap insulating film on the silicide and the first sidewalls;

(6) removing the insulating film; and (7) using the cap insulating film as a mask, removing a second exposed portion of the silicon layer to form the gate electrode.

2. A method as claimed in claim 1, wherein the first sidewalls are insulating films.

3. A method as claimed in claim 1, wherein the insulating film is formed of nitride, and the first sidewalls are formed of oxide.

4. A method as claimed in claim 1, wherein the first sidewalls are formed of silicon.

5. A method as claimed in claim 4, wherein silicide is formed on surfaces of the first exposed portion of the silicon layer and the first sidewalls.

6. A method as claimed in claim 1, wherein the silicon layer is formed of polysilicon.

7. A method as claimed in claim 1, wherein the step (5) includes the steps of;

forming a thick cap insulating film on an entire surface, and subjecting the cap insulating film to chemical mechanical polishing until a surface of the insulating film is exposed.

8. A method as claimed in claim 1, wherein the silicide is a cobalt silicide.

9. A method as claimed in claim 1, further comprising the step of forming second insulating film sidewalls at sides of the gate electrode.

10. A method for fabricating a semiconductor device, comprising the steps of:

(1) forming a gate insulating film, a polysilicon layer, and a first insulating film on a substrate in succession;

(2) selectively removing a portion of the first insulating film on which a gate electrode is to be formed;

(3) forming second insulating film sidewalls at sides of the first insulating film having the portion removed therefrom;

(4) forming silicide on a surface of a first exposed portion of the polysilicon layer;

(5) forming a cap insulating film on the silicide and the second insulating film sidewalls;

(6) removing the first insulating film; and (7) using the cap insulating film as a mask, selectively removing a second exposed portion of the polysilicon layer to form the gate electrode.

11. A method as claimed in claim 10, wherein the first insulating film is formed of nitride, and the second insulating film sidewalls are formed of oxide.

12. A method as claimed in claim 10, wherein the step (5) includes the steps of;

forming a thick cap insulating film on an entire surface, and subjecting the cap insulating film to chemical mechanical polishing until a surface of the first insulating film is exposed.

13. A method as claimed in claim 10, wherein the silicide is a cobalt suicide.

14. A method as claimed in claim 10, further comprising the step of forming third insulating film sidewalls at sides of the gate electrode.

15. A method for fabricating a semiconductor device, comprising the steps of:

(1) forming a gate insulating film, a polysilicon layer, and an insulating film on a substrate in succession;

(2) selectively removing a portion of the insulating film on which a gate electrode is to be formed;

(3) forming polysilicon sidewalls at sides of the insulating film having the portion removed therefrom;

(4) forming silicide on surfaces of a first exposed portion of the polysilicon layer and the polysilicon sidewalls;

(5) forming a cap insulating film on the silicide;

(6) removing the insulating film; and (7) using the cap insulating film as a mask, selectively removing a second exposed portion of the polysilicon layer to form the gate electrode.

16. A method as claimed in claim 15, wherein the step (5) includes the steps of;

forming a thick cap insulating film on an entire surface, and subjecting the cap insulating film to chemical mechanical polishing until a surface of the first insulating film is exposed.

17. A method as claimed in claim 15, wherein the silicide is a cobalt silicide.

18. A method as claimed in claim 15, further comprising the step of forming insulating film sidewalls at sides of the gate electrode.

* * * * *